United States Patent
Endo et al.

(10) Patent No.: US 11,917,729 B2
(45) Date of Patent: Feb. 27, 2024

(54) SUBSTRATE PROCESSING SYSTEM AND SUBSTRATE PROCESSING METHOD

(71) Applicant: Tokyo Electron Limited, Tokyo (JP)

(72) Inventors: Hiroki Endo, Miyagi (JP); Kenichiro Nakamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 602 days.

(21) Appl. No.: 16/978,808

(22) PCT Filed: Jun. 19, 2019

(86) PCT No.: PCT/JP2019/024201
§ 371 (c)(1),
(2) Date: Sep. 8, 2020

(87) PCT Pub. No.: WO2020/008871
PCT Pub. Date: Jan. 9, 2020

(65) Prior Publication Data
US 2021/0051769 A1 Feb. 18, 2021

(30) Foreign Application Priority Data
Jul. 3, 2018 (JP) .................. 2018-126555

(51) Int. Cl.
*H05B 1/02* (2006.01)
*H01L 21/67* (2006.01)
(52) U.S. Cl.
CPC ..... *H05B 1/0233* (2013.01); *H01L 21/67103* (2013.01)

(58) Field of Classification Search
CPC .......... H01L 21/3065; H01L 21/67103; H01L 21/67248; H05B 1/0233; H05H 1/46
(Continued)

(56) References Cited

U.S. PATENT DOCUMENTS 6,627,859 B1 * 9/2003 Kasai .................. G05D 23/306
219/505
2004/0011770 A1 * 1/2004 Strang ............... H01L 21/67248
219/121.36

(Continued)

FOREIGN PATENT DOCUMENTS

JP         2017-228230 A    12/2017
TW          201809944 A     3/2018

*Primary Examiner* — Sang Y Paik
(74) *Attorney, Agent, or Firm* — Nath, Goldberg & Meyer; Jerald L. Meyer; Tanya E. Harkins (57) ABSTRACT

A substrate processing system includes a stage on which a substrate is placed, a heater configured to heat the substrate by being supplied with power, a power supply part configured to supply power to the heater, a sensor configured to measure a resistance value of the heater, and a controller. The controller is configured to: store a conversion table in which a plurality of resistance values are associated with a plurality of temperatures; and acquire a reference resistance value measured by the sensor when a heater temperature is equal to a reference temperature. The controller is further configured to: acquire a temperature adjustment resistance value measured by the sensor after the substrate is heated by the heater; and control the power supply part based on the conversion table, the reference temperature, the reference resistance value, and the temperature adjustment resistance value.

7 Claims, 7 Drawing Sheets

(58) Field of Classification Search
USPC .......................................... 219/443.1–444.1
See application file for complete search history.

(56) References Cited

U.S. PATENT DOCUMENTS

| | | | |
|---|---|---|---|
| 2008/0006619 A1* | 1/2008 | Salinas | H01L 21/67248 |
| | | | 219/446.1 |
| 2012/0292305 A1* | 11/2012 | Ambal | G05D 23/22 |
| | | | 219/520 |
| 2017/0372928 A1* | 12/2017 | Yamada | H01L 21/67248 |
| 2019/0338422 A1* | 11/2019 | Durbin | H05B 3/265 |

* cited by examiner

SUBSTRATE PROCESSING SYSTEM AND SUBSTRATE PROCESSING METHOD

TECHNICAL FIELD

The present disclosure relates to a substrate processing system and a substrate processing method.

BACKGROUND

A substrate processing apparatus is known in which a plurality of heaters is provided to independently adjust temperatures of a plurality of regions of a stage on which a semiconductor wafer, which is a substrate to be processed, is placed (see Patent Document 1). In a semiconductor manufacturing process using such a substrate processing apparatus, since the temperature of the semiconductor wafer is controlled with high accuracy, it is possible to appropriately process the semiconductor.

PRIOR ART DOCUMENT

Patent Document

Patent Document 1: Japanese Laid-Open Patent Publication No. 2017-228230

SUMMARY

The present disclosure provides a substrate processing system and a substrate processing method for adjusting a temperature of a substrate with high accuracy.

A substrate processing system according to an aspect of the present disclosure includes a stage on which a substrate is placed, a heater configured to heat the substrate by being supplied with power, a power supply part configured to supply power to the heater, a sensor configured to measure a resistance value of the heater, and a controller. The controller is configured to: store a conversion table in which a plurality of resistance values are associated with a plurality of temperatures; and acquire a reference resistance value measured by the sensor when a heater temperature is equal to a reference temperature. The controller is further configured to: acquire a temperature adjustment resistance value measured by the sensor when the substrate is heated by the heater; and control the power supply part based on the conversion table, the reference resistance value, and the temperature adjustment resistance value.

According to the present disclosure, it is possible to adjust a temperature of a substrate with high accuracy.

DETAILED DESCRIPTION

Examples of a disclosed substrate processing system and substrate processing method will be described in detail below with reference to the drawings. The technology disclosed herein is not limited by the following examples. Respective examples may be appropriately combined within a range in which the processing contents thereof do not contradict each other.

[Configuration of Substrate Processing Apparatus 10]

Figure 1:
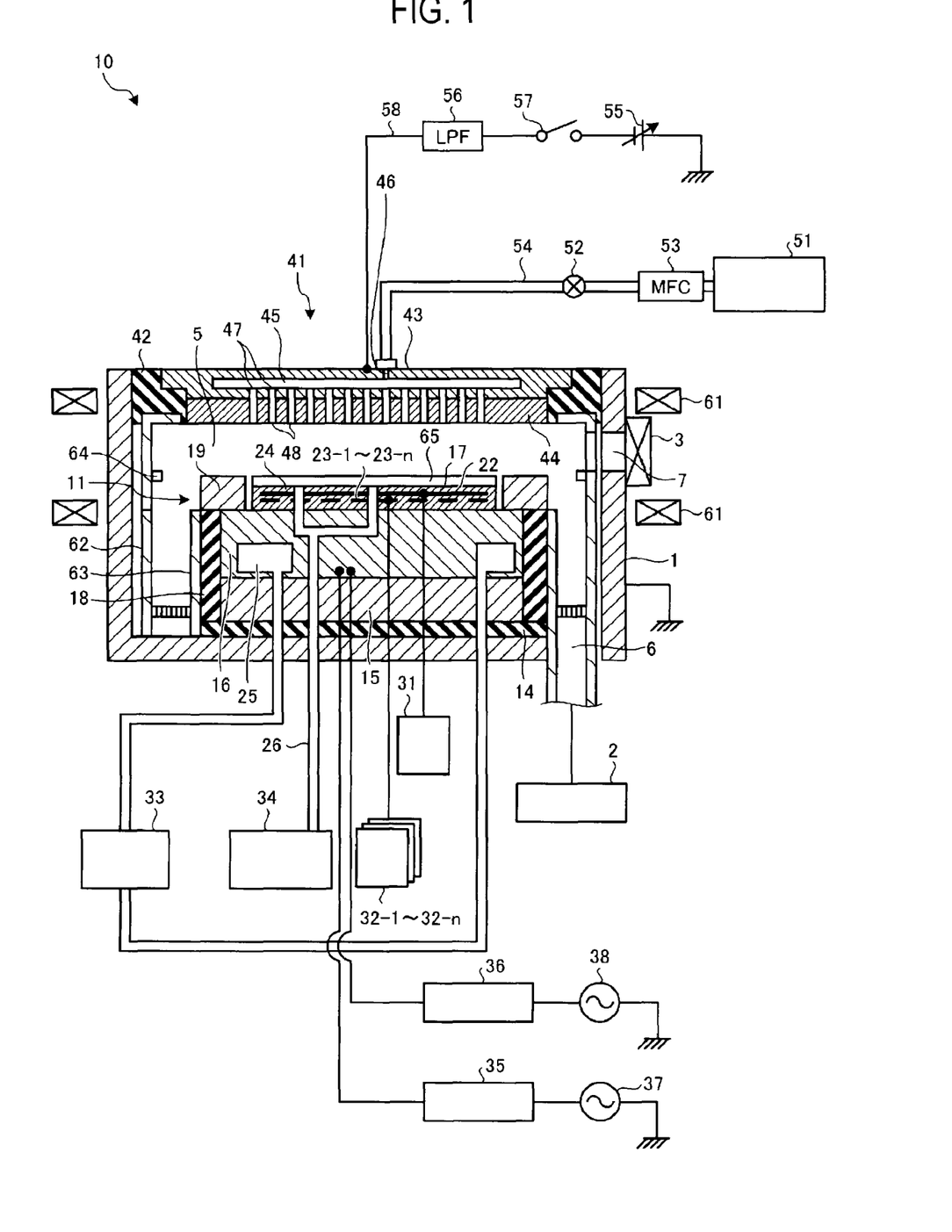
FIG. 1 is a vertical cross-sectional view illustrating an exemplary substrate processing apparatus provided in a substrate processing system according to an embodiment.

FIG. 1 is a vertical cross-sectional view illustrating an exemplary substrate processing apparatus provided in a substrate processing system according to an embodiment. As shown in FIG. 1, the substrate processing apparatus 10 includes a chamber 1, an exhaust apparatus 2, and a gate valve 3. The chamber 1 is made of aluminum and has a substantially cylindrical shape. The surface of the chamber 1 is coated with an anodic oxide film. A processing space 5 is formed inside the chamber 1. The chamber 1 isolates the processing space 5 from the external atmosphere. An exhaust port 6 and an opening 7 are formed in the chamber 1. The exhaust port 6 is formed at the bottom of the chamber 1. The opening 7 is formed in the side wall of the chamber 1. The exhaust apparatus 2 is connected to the processing space 5 of the chamber 1 via the exhaust port 6. The exhaust apparatus 2 exhausts gas from the processing space 5 through the exhaust port 6 so as to depressurize the processing space 5 to a predetermined degree of vacuum. The gate valve 3 opens or closes the opening 7.

[Configuration of Stage 11]

The substrate processing apparatus 10 further includes a stage 11. The stage 11 is disposed in a lower part of the processing space 5. The stage 11 includes an insulating plate 14, a support 15, a base material 16, an electrostatic chuck 17, an inner wall member 18, a focus ring 19, an electrode 22, a plurality of heaters 23-1 to 23-$n$ ($n$=2, 3, 4, . . . ), and a temperature sensor 24. The insulating plate 14 is made of an insulating material, and is supported on the bottom of the chamber 1. The support 15 is made of a conductor. The support 15 is disposed on the insulating plate 14, and is supported on the bottom of the chamber 1 via the insulating plate 14 such that the support 15 and the chamber 1 are electrically insulated.

The base material 16 is formed of a conductor such as aluminum. The base material 16 is disposed on the support 15, and is supported on the bottom of the chamber 1 via the support 15. The electrostatic chuck 17 is disposed on the base material 16 and is supported on the bottom of the chamber 1 via the base material 16. The electrostatic chuck 17 is made of an insulator. The electrode 22 and the plurality of heaters 23-1 to 23-$n$ are embedded inside the electrostatic chuck 17. The temperature sensor 24 indirectly measures the plurality of heaters 23-1 to 23-$n$ by measuring a temperature of the electrostatic chuck 17.

The inner wall member 18 is formed of an insulator such as quartz, and has a cylindrical shape. The inner wall member 18 is disposed around the base material 16 and the support 15 such that the base material 16 and the support 15 are disposed inside the inner wall member 18, and surrounds the base material 16 and the support 15. The focus ring 19 is made of single-crystal silicon, and has a ring shape. The focus ring 19 is disposed on the outer circumference of the electrostatic chuck 17 such that the electrostatic chuck 17 is disposed inside the focus ring 19, and surrounds the electrostatic chuck 17. The stage 11 is further provided with a coolant circulation channel 25 and a heat transfer gas supply channel 26. The coolant circulation channel 25 is formed inside the base material 16. The heat transfer gas supply channel 26 is formed to penetrate the electrostatic chuck 17, and one end of the heat transfer gas supply channel 26 is formed on a top surface of the electrostatic chuck 17.

The substrate processing apparatus 10 further includes a DC power source 31, a plurality of power supply parts 32-1 to 32-$n$, a chiller unit 33, and a heat transfer gas supply part 34. The DC power source 31 is electrically connected to the electrode 22 of the electrostatic chuck 17. The DC power source 31 applies a DC voltage to the electrode 22. The plurality of power supply parts 32-1 to 32-$n$ correspond to the plurality of heaters 23-1 to 23-$n$, respectively. The chiller unit 33 is connected to the coolant circulation channel 25. The chiller unit 33 cools a coolant to a predetermined temperature, and circulates the cooled coolant in the coolant circulation channel 25 inside the base material 16. The heat transfer gas supply part 34 is connected to the heat transfer gas supply channel 26. The heat transfer gas supply part 34 supplies a heat transfer gas, such as He gas, to the heat transfer gas supply channel 26.

The substrate processing apparatus 10 further includes a first high-frequency power source 37 and a second high-frequency power source 38. The first high-frequency power source 37 is connected to the base material 16 via a first matcher 35. The second high-frequency power source 38 is connected to the base material 16 via a second matcher 36. The first high-frequency power source 37 supplies high-frequency power having a predetermined frequency (e.g., 100 MHz) to the base material 16. The second high-frequency power source 38 supplies the base material 16 with high-frequency power having a frequency (e.g., 13 MHz) lower than the frequency of the high-frequency power supplied to the base material 16 by the first high-frequency power source 37.

[Configuration of Shower Head 41]

The substrate processing apparatus 10 further includes a shower head 41. The shower head 41 is disposed above the stage 11 in the processing space 5 such that a bottom surface of the shower head 41 faces the stage 11 and the plane of the bottom surface of the shower head 41 is substantially parallel to the plane of the top surface of the stage 11. The shower head 41 includes an insulating member 42, a body 43, and an upper ceiling plate 44. The insulating member 42 is made of an insulating material, and is supported in an upper portion of the chamber 1. The body 43 is made of, for example, a conductor, such as aluminum having an anodized surface. The body 43 is supported in the chamber 1 via the insulating member 42 such that the body 43 and the chamber 1 are electrically insulated. The body 43 and the base material 16 are used as a pair of upper and lower electrodes. The upper ceiling plate 44 is formed of a silicon-containing material, such as quartz. The upper ceiling plate 44 is disposed in a lower portion of the body 43, and is supported on the body 43 to be detachable from the body 43.

A gas diffusion chamber 45, a gas inlet 46, and a plurality of gas outlets 47 are formed in the body 43. The gas diffusion chamber 45 is formed inside the body 43. The gas inlet 46 is formed above the gas diffusion chamber 45 in the body 43 and communicates with the gas diffusion chamber 45. The plurality of gas outlets 47 is formed on the upper ceiling plate 44 side of the gas diffusion chamber 45 in the body 43 and communicates with the gas diffusion chamber 45. A plurality of gas inlets 48 is formed in the upper ceiling plate 44. The plurality of gas inlets 48 is formed so as to penetrate the top surface and the bottom surface of the upper ceiling plate 44, and to communicate with the plurality of gas outlets 47, respectively.

The substrate processing apparatus 10 further includes a processing gas supply source 51, a valve 52, and a mass flow controller (MFC) 53. The processing gas supply source 51 is connected to the gas inlet 46 in the body 43 of the shower head 41 via a pipe 54. The mass flow controller 53 is provided in the middle of the pipe 54. The valve 52 is provided between the mass flow controller 53 and the gas inlet 46 in the pipe 54. When the valve 52 is opened or closed, the processing gas is supplied from the processing gas supply source 51 to the gas inlet 46, or the processing gas is blocked from being supplied from the processing gas supply source 51 to the gas inlet 46.

The substrate processing apparatus 10 further includes a variable DC power source 55, a low-pass filter (LPF) 56, and a switch 57. The variable DC power source 55 is electrically connected to the body 43 of the shower head 41 via an electric path 58. The low-pass filter 56 and the switch 57 are provided in the middle of the electric path 58. The switch 57 is opened and closed so as to apply a DC voltage to the shower head 41, or to block the application of a DC voltage to the shower head 41.

The substrate processing apparatus 10 further includes a ring magnet 61. The ring magnet 61 is formed of a permanent magnet, and has a ring shape. The ring magnet 61 is arranged concentrically with the chamber 1 such that the chamber 1 is arranged inside the ring magnet 61. The ring magnet 61 is rotatably supported by the chamber 1 via a rotation mechanism (not illustrated). The ring magnet 61 forms a magnetic field in a region of the processing space 5 between the shower head 41 and the stage 11.

The substrate processing apparatus 10 further includes a deposition shield 62, a deposition shield 63, and a conductive member 64. The deposition shield 62 is disposed so as to cover the inner wall surface of the chamber 1, and is supported by the chamber 1 to be detachable from the chamber 1. The deposition shield 62 prevents an etching byproduct (deposit) from adhering to the inner wall surface of the chamber 1. The deposition shield 63 is disposed to cover the outer peripheral surface of the inner wall member 18. The deposition shield 63 prevents the etching byproduct from adhering to the outer peripheral surface of the inner wall member 18. The conductive member 64 is arranged in the processing space 5 such that the height at which the conductive member 64 is arranged is substantially the same as the height at which a wafer 65 placed on the stage 11 is arranged, and is supported by the deposition shield 62. The conductive member 64 is formed of a conductor, and is electrically connected to a ground. The conductive member 64 suppresses abnormal discharge in the chamber 1.

[Electrostatic Chuck 17]

Figure 2:
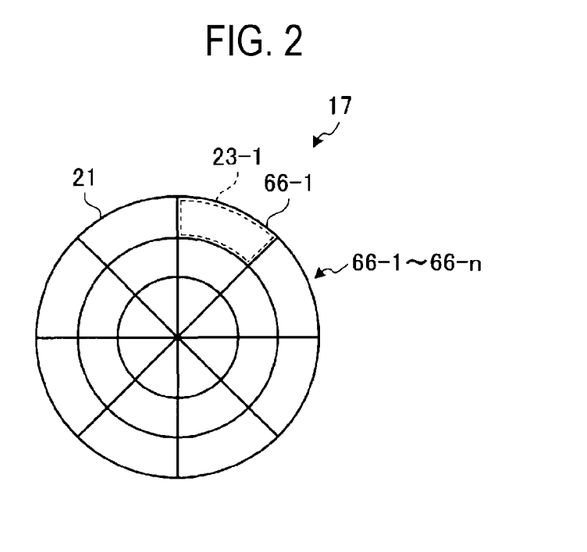
FIG. 2 is a top plan view illustrating an exemplary electrostatic chuck provided in the substrate processing apparatus according to the embodiment.

FIG. 2 is a top plan view illustrating an exemplary electrostatic chuck 17 provided in the substrate processing apparatus 10 according to the embodiment. A placement surface of the electrostatic chuck 17 that faces the wafer 65 placed on the stage 11 is divided into a plurality of regions 66-1 to 66-n, as illustrated in FIG. 2. The shape of each of the plurality of regions 66-1 to 66-n is not limited to the example illustrated in FIG. 2, and the placement surface may be divided into a plurality of regions having shapes that are different from the shapes of the plurality of regions 66-1 to 66-n. The plurality of regions 66-1 to 66-n correspond to the plurality of heaters 23-1 to 23-n, respectively. Among the plurality of heaters 23-1 to 23-n, one heater 23-1 corresponding to one region 66-1 is embedded near the region 66-1 in the electrostatic chuck 17. The heater 23-1 heats the electrostatic chuck 17 around the region 66-1 when AC power is supplied thereto. Among the plurality of heaters 23-1 to 23-n, similarly to the heater 23-1, each of the heaters other than the heater 23-1 also heats the electrostatic chuck 17 around a region corresponding thereto among the plurality of regions 66-1 to 66-n when AC power is supplied thereto.

[Configuration of Plurality of Power Supply Parts 32-1 to 32-n]

Figure 3:
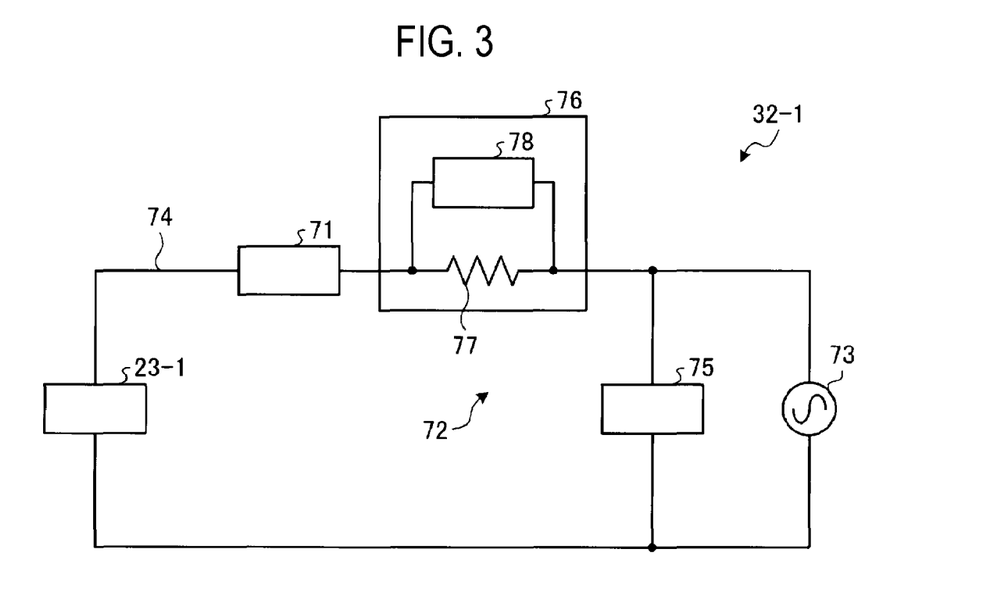
FIG. 3 is a circuit diagram illustrating one exemplary power supply part corresponding to one heater among a plurality of power supply parts included in the substrate processing apparatus of the embodiment.

The plurality of power supply parts 32-1 to 32-n correspond to the plurality of heaters 23-1 to 23-n, respectively. FIG. 3 is a circuit diagram illustrating one exemplary power supply part 32-1 corresponding to one heater 23-1 among the plurality of power supply parts 32-1 to 32-n included in the substrate processing apparatus 10 of the embodiment. The power supply part 32-1 includes a switch 71 and a resistance value sensor 72. The switch 71 is provided in the middle of a heater power supply electric path 74 that connects the AC power source 73 and the heater 23-1. The AC power source 73 is provided in a factory in which the substrate processing apparatus 10 is installed so as to supply AC power to the substrate processing apparatus 10, and also supplies AC power to apparatuses other than the substrate processing apparatus 10. When the switch 71 is closed, power is supplied from the AC power source 73 to the heater 23-1, and when the switch 71 is opened, power supply from the AC power source 73 to the heater 23-1 is interrupted.

The resistance value sensor 72 includes a voltmeter 75 and an ammeter 76. The voltmeter 75 measures the voltage applied to the heater 23-1. The ammeter 76 includes a shunt resistor 77 and a voltmeter 78. The shunt resistor 77 is provided in the middle of the heater power supply electric path 74. The resistance value of the shunt resistor 77 is, for example, 10 ma The voltmeter 78 measures the voltage applied to the shunt resistor 77. The ammeter 76 measures the current flowing through the heater 23-1 based on the voltage measured by the voltmeter 78. The resistance value sensor 72 measures the resistance value of the heater 23-1 based on the voltage measured by the voltmeter 75 and the current value measured by the ammeter 76. The resistance value of the heater 23-1 is equal to a value obtained by dividing the voltage measured by the voltmeter 75 by the current value measured by the ammeter 76. Among the plurality of power supply parts 32-1 to 32-n, another power supply part different from the power supply part 32-1 also includes a switch and a resistance value sensor, like the power supply part 32-1. That is, the substrate processing apparatus 10 includes a plurality of resistance value sensors corresponding to the plurality of heaters 23-1 to 23-n. Like the power supply part 32-1, the power supply part supplies AC power from the AC power source 73 to a heater corresponding to the power supply part among the plurality of heaters 23-1 to 23-n, and measures the resistance value of the heater.

[Configuration of Controller 80]

Figure 4:
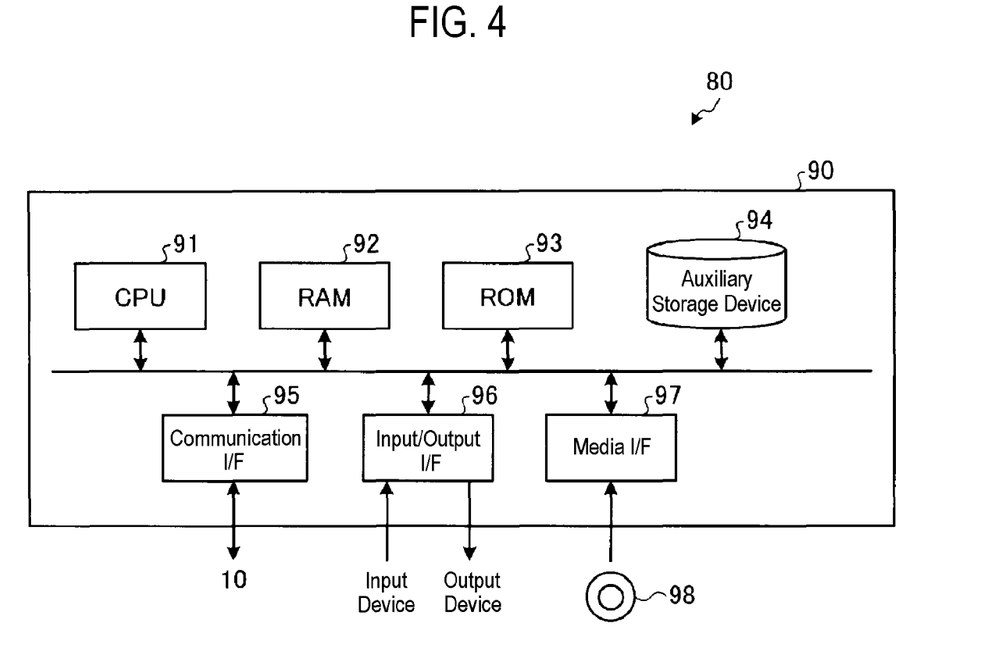
FIG. 4 is a view illustrating an exemplary controller included in the substrate processing system according to the embodiment.

The substrate processing system further includes a controller 80 as illustrated in FIG. 4. FIG. 4 is a view illustrating an exemplary controller 80 included in the substrate processing system according to the embodiment. The controller 80 is implemented by a computer 90. The computer 90 includes a central processing unit (CPU) 91, a random access memory (RAM) 92, and a read-only memory (ROM) 93. The CPU 91 operates based on a program installed in the computer 90, controls each part of the computer 90, and controls each part of the substrate processing apparatus 10. The ROM 93 stores a boot program executed by the CPU 91 when the computer 90 is activated, and a program depending on the hardware of the computer 90.

The computer 90 further includes an auxiliary storage device 94, a communication I/F 95, an input/output I/F 96, and a media I/F 97. The auxiliary storage device 94 stores a program executed by the CPU 91 and data used by the program. The auxiliary storage device 94 may be, for example, a hard disk drive (HDD) or a solid-state drive (SSD). The CPU 91 reads the program from the auxiliary storage device 94, loads the program into the RAM 92, and executes the loaded program.

The communication I/F 95 communicates with the substrate processing apparatus 10 via a communication line, such as a local area network (LAN). The communication I/F 95 sends information received from the substrate processing apparatus 10 via the communication line to the CPU 91, and transmits data generated by the CPU 91 to the substrate processing apparatus 10 via the communication line.

The computer 90 further includes an input device such as a keyboard, and an output device such as a display. The CPU 91 controls the input device and the output device via the input/output I/F 96. The input/output I/F 96 transmits a signal input via the input device to the CPU 91, and outputs the data generated by the CPU 91 to the output device.

The media I/F 97 reads a program or data recorded in a non-transitory recording medium 98. The recording medium 98 may be, for example, an optical recording medium, a magneto-optical recording medium, a tape medium, a magnetic recording medium, or a semiconductor memory. The optical recording medium may be, for example, a digital versatile disc (DVD) and a phase change rewritable disc (PD). The magneto-optical recording medium may be, for example, a magneto-optical disk (MO).

The CPU 91 stores a program read from the recording medium 98 via the media I/F 97 in the auxiliary storage device 94. As another example, the program acquired from another device via a communication line may be stored in the auxiliary storage device 94.

Figure 5:
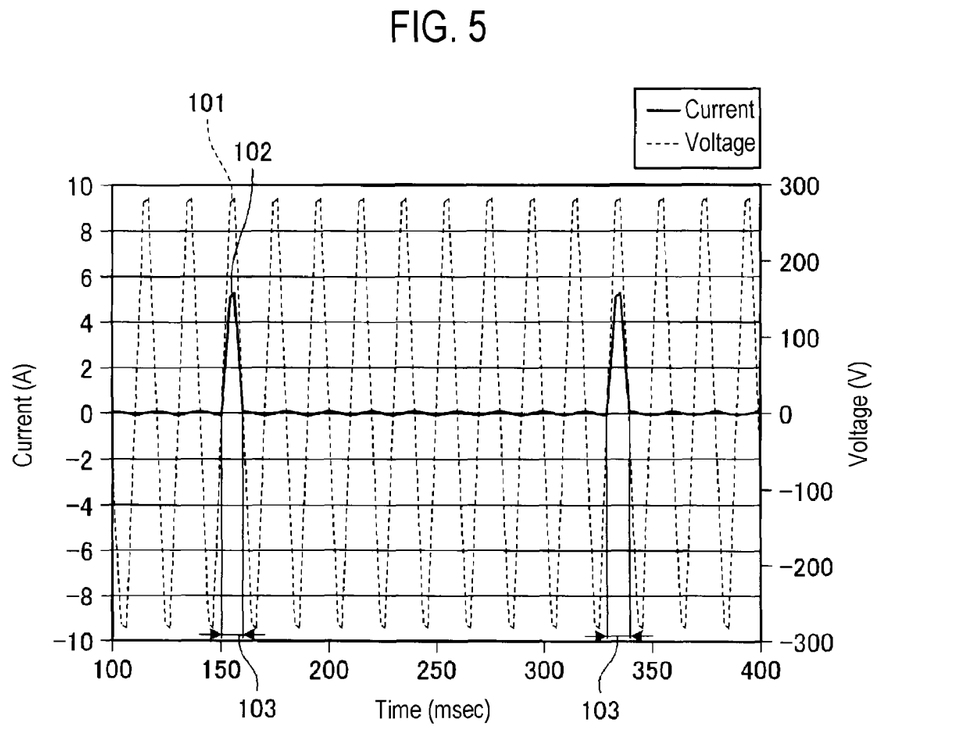
FIG. 5 is a view illustrating an exemplary waveform of an AC voltage output from an AC power source that supplies power to the substrate processing apparatus of the embodiment, and an exemplary waveform of a current flowing through a heater.

FIG. 5 shows an exemplary waveform 101 of an AC voltage output from the AC power source 73 that supplies power to the substrate processing apparatus 10 of the embodiment, and an exemplary waveform 102 of a current flowing through the heater 23-1. The waveform 101 of the AC voltage indicates that the AC power source 73 outputs an AC voltage having a predetermined frequency (e.g., 50 Hz) along a sine curve. The waveform 102 of the current indicates that the power is not supplied from the AC power source 73 to the heater 23-1 in all the periods in which the AC voltage is negative. The current waveform 102 further indicates that power is supplied from the AC power source 73 to the heater 23-1 during a plurality of predetermined energization periods 103 among a plurality of periods in which the AC voltage is positive. That is, the length of each of the plurality of energization periods 103 is equal to half the cycle of the AC voltage output from the AC power source 73.

That is, when the AC voltage output from the AC power source 73 is negative, the controller 80 opens the switch 71 of the power supply part 32-1 such that the AC voltage is not applied to the heater 23-1. The controller 80 further sets a plurality of energization periods 103 such that the ratio of the plurality of energization periods 103 to the plurality of periods in which the AC voltage is positive is equal to a predetermined ratio. The controller 80 further closes the switch 71 of the power supply part 32-1 such that the AC voltage is applied to the heater 23-1 during the energization periods 103.

Figure 6:
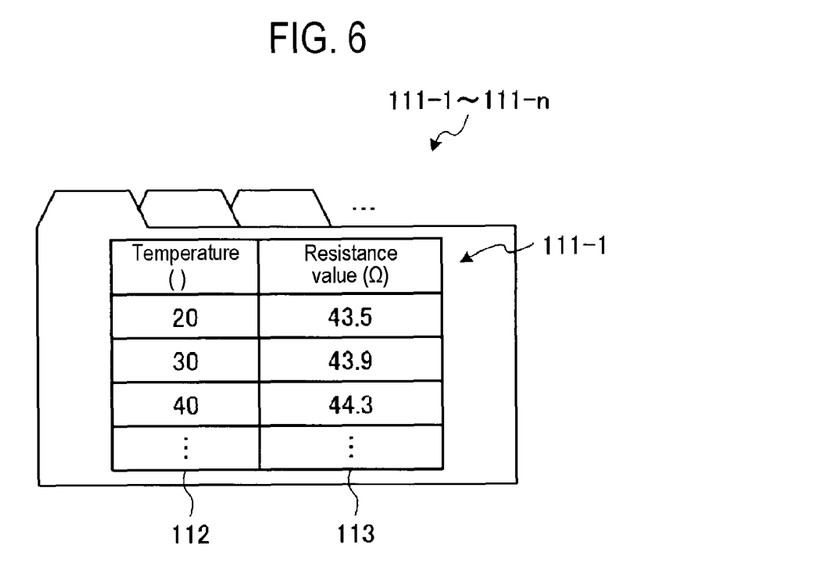
FIG. 6 is a view illustrating a plurality of exemplary conversion tables stored in the controller included in the substrate processing system of the embodiment.

As illustrated in FIG. 6, the controller 80 stores a plurality of conversion tables 111-1 to 111-n in the auxiliary storage device 94. FIG. 6 is a view illustrating the plurality of exemplary conversion tables 111-1 to 111-n stored in the controller 80 included in the substrate processing system of the embodiment. The plurality of conversion tables 111-1 to 111-n correspond to the plurality of heaters 23-1 to 23-n, respectively. Among the plurality of conversion tables 111-1 to 111-n, in the conversion table 111-1 corresponding to the heater 23-1, a plurality of temperatures 112 are associated with a plurality of resistance values 113. As the plurality of temperatures 112, 11 preset temperatures set in steps of 10 degrees C. from 20 degrees C. to 120 degrees C. are described by way of example. A resistance value corresponding to a certain temperature among the plurality of resistance values 113 is equal to the resistance value of the heater 23-1 when that temperature is equal to the temperature of the heater 23-1.

The conversion table 111-1 is generated before the electrostatic chuck 17 is installed in the substrate processing apparatus 10. For example, a user measures the distribution of radiation quantity of infrared rays radiated from the top surface of the electrostatic chuck 17 using an infrared camera, and acquires the temperature of each of the plurality of heaters 23-1 to 23-n. The user supplies a predetermined level of power to the heater 23-1 and measures the voltage applied to the heater 23-1 and the current flowing through the heater 23-1 during a predetermined period in which the temperature of the heater 23-1 is equal to a predetermined temperature, and the user calculates the resistance value of the heater 23-1 based on the voltage and the current. The user generates the conversion table 111-1 such that the acquired temperatures of the heater 23-1 are associated with the acquired resistance values of the heater 23-1.

Among the plurality of conversion tables 111-1 to 111-n, the conversion tables other than the conversion table 111-1 are also formed similarly to the conversion table 111-1. In a conversion table among the plurality of conversion tables 111-1 to 111-n, the temperatures of a heater corresponding to that conversion table among the plurality of heaters are associated to correspond to the resistance values of that heater.

[Substrate processing Method]

A substrate processing method of an embodiment is executed using a substrate processing system, and includes an offset adjustment and a plasma-etching method.

The offset adjustment is executed, for example, when the substrate processing apparatus 10 is installed in a factory. The controller 80 controls the chiller unit 33 to circulate the coolant cooled to a predetermined chiller temperature in the coolant circulation channel 25 so as to cool the electrostatic chuck 17. The controller 80 measures the temperatures of the plurality of heaters 23-1 to 23-n by controlling the temperature sensor 24 while the electrostatic chuck 17 is being cooled. When the electrostatic chuck 17 is sufficiently cooled by the chiller unit 33, for example, for 120 minutes or more, the temperature becomes constant and the temperature distribution becomes uniform. Further, the temperatures of the plurality of heaters 23-1 to 23-n become equal to the temperature of the electrostatic chuck 17 when the electrostatic chuck 17 is sufficiently cooled, and the temperatures become equal to each other. After the electrostatic chuck 17 is sufficiently cooled, the controller 80 controls the auxiliary storage device 94 to store a reference temperature measured by the temperature sensor 24 in the auxiliary storage device 94.

Figure 7:
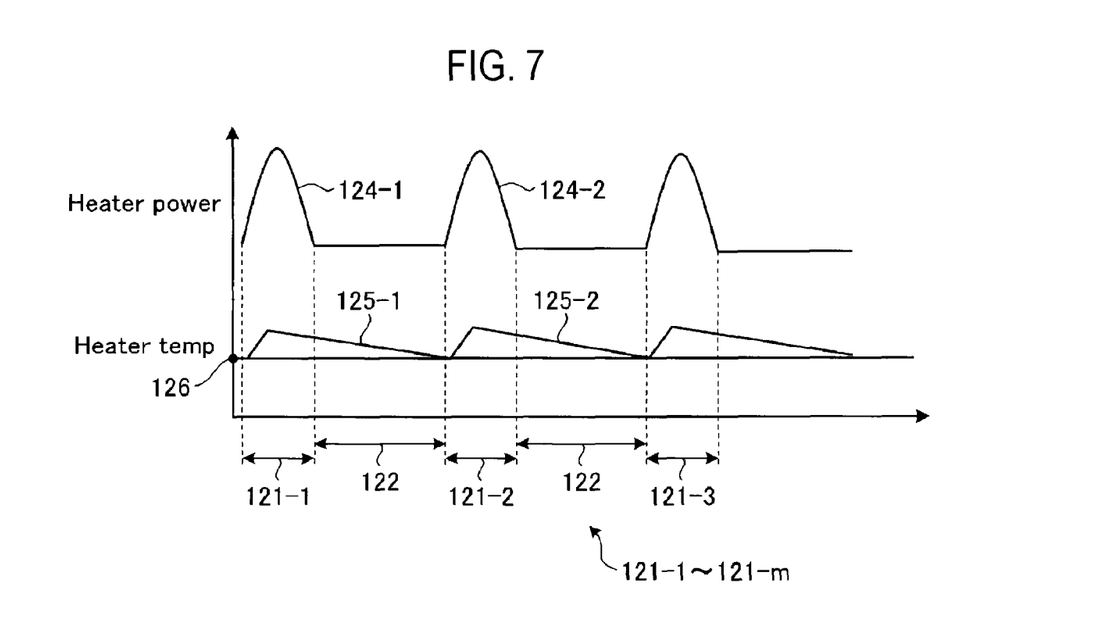
FIG. 7 is a view illustrating a plurality of exemplary measurement periods in which AC power is supplied from an AC power source to any of a plurality of heaters in an offset adjustment by a substrate processing method of an embodiment, and exemplary changes in AC power and temperature.

After the electrostatic chuck 17 is sufficiently cooled, the controller 80 opens/closes the switches 71 of the plurality of power supply parts 32-1 to 32-n so as to supply AC power to the plurality of heaters 23-1 to 23-n at a predetermined timing. FIG. 7 is a view illustrating a plurality of exemplary measurement periods in which AC power is supplied from the AC power source 73 to any of the plurality of heaters 23-1 to 23-n in an offset adjustment by a substrate processing method of an embodiment, and exemplary changes in AC power and temperature. As illustrated in FIG. 7, the lengths of the plurality of measurement periods 121-1 to 121-m are equal to each other, and are equal to half the cycle of the AC voltage output from the AC power source 73. Further, the interval 122 between the plurality of measurement periods 121-1 to 121-m is equal to a predetermined length (for example, 5 sec). That is, the plurality of measurement periods 121-1 to 121-m are intermittently formed at an equal interval.

The controller 80 opens/closes the switches 71 of the plurality of power supply parts 32-1 to 32-n in the measurement period 121-1 so as to supply the AC power 124-1 to a plurality of (for example, four) first heaters among the plurality of heaters 23-1 to 23-n. In this case, a plurality of first regions corresponding to the plurality of first heaters among the plurality of regions 66-1 to 66-n are not adjacent to each other. That is, the contours of any two first regions selected from the plurality of first regions do not have overlapping portions. Further, the contours of the two first regions may share one point. The controller 80 respectively measures the resistance values of the plurality of first heaters by controlling the resistance value sensors 72 of the plurality of power supply parts 32-1 to 32-n during the measurement period 121-1.

A temperature change 125-1 indicates a change in the temperature of one first heater among the plurality of first heaters. The temperature change 125-1 indicates that the AC power 124-1 is supplied to the first heater during the measurement period 121-1, and thus the temperature of the first heater increases during the measurement period 121-1. The temperature change 125-1 also indicates that the AC power is not supplied to the first heater after the measurement period 121-1 ends, and thus the temperature of the first heater decreases. The temperature change 125-1 also indicates that the temperature of the first heater becomes substantially equal to a chiller temperature 126 in the measurement period 121-2 following the measurement period 121-1 among the plurality of measurement periods 121-1 to 121-$m$. That is, the length of the interval 122 is set such that, when one of the plurality of heaters 23-1 to 23-$n$ is supplied with power in the measurement period 121-1, the temperature of the heater decreases until the temperature of the heater becomes substantially equal to the chiller temperature in the measurement period 121-2.

The controller 80 opens/closes the switches 71 of the plurality of power supply parts 32-1 to 32-$n$ in the measurement period 121-2 so as to supply the AC power to a plurality of second heaters different from the plurality of first heaters among the plurality of heaters 23-1 to 23-$n$. In this case, a plurality of second regions corresponding to the plurality of second heaters among the plurality of regions 66-1 to 66-$n$ are not adjacent to each other. Further, the plurality of second regions are not adjacent to any of the plurality of first regions. The controller 80 respectively measures the resistance values of the second heaters by controlling the resistance value sensors 72 of the plurality of power supply parts 32-1 to 32-$n$ during the measurement period 121-2.

A combination of a plurality of heaters for which resistance values are measured in each of a plurality of measurement periods 121-1 to 121-$m$ is set similarly to the plurality of second heaters. For example, a plurality of third heaters for which resistance values are measured in the measurement period 121-3 are set such that the plurality of third regions corresponding to the plurality of third heaters among the plurality of regions 66-1 to 66-$n$ are not adjacent to each other, and such that the plurality of third regions are not adjacent to the plurality of second regions. The combination is also set such that when all of the plurality of measurement periods 121-1 to 121-$m$ have passed, the resistance value of each of the plurality of heaters 23-1 to 23-$n$ is measured a predetermined number of times (e.g., 50 times).

The controller 80 controls the auxiliary storage device 94 after the resistance value of each of the plurality of heaters 23-1 to 23-$n$ has been measured the predetermined number of times, whereby a plurality of reference resistance values corresponding to the plurality of heaters 23-1 to 23-$n$ are stored in the auxiliary storage device 94. Among the plurality of reference resistance values, the reference resistance value corresponding to the heater 23-1 indicates the average of a plurality of resistance values measured by the resistance value sensor 72 of the power supply part 32-1. When the variation in the resistance values measured by the resistance value sensor 72 of any of the plurality of power supply parts 32-1 to 32-$n$ is larger than a predetermined value, the controller 80 executes the offset adjustment again from the beginning.

After the reference resistance values are acquired, the controller 80 generates a plurality of post-correction conversion tables corresponding to the plurality of heaters 23-1 to 23-$n$ based on the plurality of conversion tables 111-1 to 111-$n$, the reference temperature, and the plurality of reference resistance values. Among the plurality of post-correction conversion tables, the post-correction conversion table corresponding to the heater 23-1 is generated based on the conversion table 111-1, the reference temperature, and the reference resistance value corresponding to the heater 23-1 among the plurality of reference resistance values. In the post-correction conversion table, a plurality of resistance values are associated with the plurality of temperatures 112 of the conversion table 111-1. The plurality of resistance values are equal to a value obtained by adding a predetermined value to the plurality of resistance values 113 in the conversion table 111-1 so that, in the post-correction conversion table, the reference resistance values are associated to correspond to the reference temperatures. After a plurality of post-correction tables are generated, the controller 80 stores the plurality of post-correction conversion tables in the auxiliary storage device 94 by controlling the auxiliary storage device 94.

[Plasma-Etching Method]

The plasma-etching method is performed after the offset adjustment is performed. In the plasma-etching method, first, the controller 80 controls the gate valve 3 to open the opening 7. A wafer 65 to be processed is loaded into the processing space 5 in the chamber 1 through the opening 7 and is placed on the stage 11 when the opening 7 is opened. After the wafer 65 is placed on the stage 11, the controller 80 controls the DC power source 31 to apply a DC voltage to the electrode 22 so as to hold the wafer 65 on the electrostatic chuck 17 by Coulomb force. The controller 80 closes the opening 7 by controlling the gate valve 3 after the wafer 65 is held on the stage 11.

When the opening 7 is closed, the controller 80 controls the exhaust apparatus 2 to evacuate the atmosphere in the processing space 5 to a predetermined degree of vacuum. The controller 80 further controls the valve 52 to supply a predetermined amount of processing gas from the processing gas supply source 51 to the gas inlet 46. The processing gas supplied from the processing gas supply source 51 to the gas inlet 46 is supplied to the gas diffusion chamber 45, and is then supplied to the processing space 5 in the chamber 1 via the plurality of gas outlets 47 and the plurality of gas inlets 48 in the form of a shower.

While the wafer 65 is held on the electrostatic chuck 17, the controller 80 supplies a heat transfer gas to the space between the electrostatic chuck 17 and the wafer 65 by controlling the heat transfer gas supply part 34 to supply the heat transfer gas to the heat transfer gas supply channel 26. The controller 80 further controls the chiller unit 33 to circulate the coolant cooled to a predetermined temperature in the coolant circulation channel 25 so as to cool the electrostatic chuck 17.

While the wafer 65 is held on the electrostatic chuck 17, the controller 80 opens/closes the switch 71 of the power supply part 32-1 such that AC power is supplied from the AC power source 73 to the heater 23-1 during a plurality of energization periods 103. The controller 80 further controls the resistance value sensor 72 of the power supply part 32-1 to measure the resistance value of the heater 23-1 for each of the plurality of energization periods 103. The controller 80 refers to the post-correction conversion table corresponding to the heater 23-1 among the plurality of post-correction conversion tables, and calculates the temperature of the heater 23-1 based on the measured resistance value. The calculated temperature is equal to the temperature associated with the measured resistance value by the post-correction conversion table. When the calculated temperature is lower than a target temperature, the controller 80 changes the plurality of energization periods 103 such that the ratio of the plurality of energization periods 103 to the plurality of periods in which the AC voltage output from the AC power source 73 is positive increases. When the calculated temperature is higher than the target temperature, the controller 80 changes the plurality of energization periods 103 such that the ratio of the plurality of energization periods 103 to the plurality of periods in which the AC voltage output is positive decreases. The controller 80 opens/closes the switch 71 of the power supply part 32-1 to supply AC power from the AC power source 73 to the heater 23-1 during the changed plurality of energization periods 103.

By changing the ratio of the plurality of energization periods 103 as described above, the controller 80 is capable of adjusting the temperature of the heater 23-1 with high accuracy such that the temperature of the heater 23-1 becomes the target temperature. With respect to any heater other than the heater 23-1 among the plurality of heaters 23-1 to 23-n, the controller 80 also adjusts the temperature using the post-correction conversion table corresponding to the heater among the plurality of post-correction conversion tables, similarly to the heater 23-1. In this case, the temperature of the wafer 65 is adjusted to reach the target temperature since heat is transferred from the electrostatic chuck 17 to the wafer 65 through the heat transfer gas supplied to the space between the electrostatic chuck 17 and the wafer 65.

After the temperature of the wafer 65 is adjusted to the predetermined temperature, the controller 80 controls the first high-frequency power source 37 and the second high-frequency power source 38 to supply high-frequency power to the base material 16 of the stage 11. Since the high-frequency power is supplied to the base material 16 of the stage 11, plasma is generated in the region of the processing space 5 between the stage 11 and the shower head 41. The controller 80 controls the variable DC power source 55 and the switch 57 to apply a DC voltage of a predetermined magnitude from the variable DC power source 55 to the shower head 41. At this time, the wafer 65 is etched by the plasma generated in the processing space 5.

After the wafer 65 is appropriately etched, the controller 80 controls the first high-frequency power source 37 and the second high-frequency power source 38 so as to stop the supply of high-frequency power to the base material 16 of the stage 11. The controller 80 further controls the variable DC power source 55 and the switch 57 to prevent the DC voltage from being applied to the shower head 41. The controller 80 further controls the gate valve 3 to open the opening 7. The controller 80 further controls the DC power source 31 to release the wafer 65 held by the electrostatic chuck 17. The wafer 65 is unloaded from the processing space 5 of the chamber 1 through the opening 7 when the wafer 65 is not held by the electrostatic chuck 17 and the opening 7 is opened. According to this plasma-etching method, the temperature of the wafer 65 can be appropriately adjusted to a predetermined temperature, and thus the wafer 65 can be appropriately etched.

Figure 8:
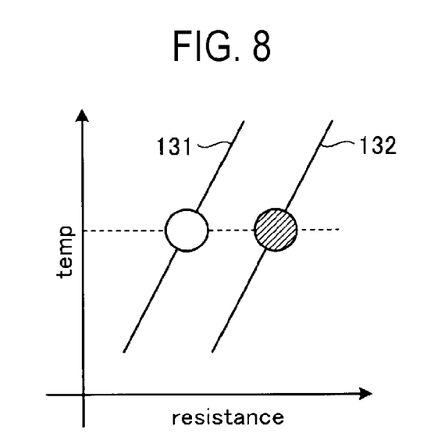
FIG. 8 is a graph showing a relationship between the resistance value and the temperature of a heater included in the substrate processing apparatus of the embodiment.

FIG. 8 is a graph showing a relationship between the resistance value of the heater 23-1 and the temperature of the heater 23-1 included in the substrate processing apparatus 10 of the embodiment. A line 131 in the graph of FIG. 8 shows the relationship between the resistance value of the heater 23-1 and the temperature of the heater 23-1. The line 131 indicates that the resistance value of the heater 23-1 increases as the temperature of the heater 23-1 increases. A line 132 in the graph of FIG. 8 shows a relationship between the resistance value measured by the resistance value sensor 72 of the power supply part 32-1 and the temperature of the heater 23-1. The line 132 indicates that the resistance value measured by the resistance value sensor 72 of the power supply part 32-1 increases as the temperature of the heater 23-1 increases.

The resistance value measured by the resistance value sensor 72 of the power supply part 32-1 may be different from the resistance value of the heater 23-1 due to electrical elements provided in the electric circuit including the heater 23-1 and the resistance value sensor 72. The electrical elements may include, for example, a wire, a terminal, and a filter. The graph of FIG. 8 shows that the line 131 and the line 132 have substantially the same shape, and indicates that the line 131 substantially overlaps the line 132 by translating the line 131 parallel to the horizontal axis. The graph of FIG. 8 indicates that, in the post-correction conversion table generated from the conversion table 111-1 by the offset adjustment, the resistance value measured by the resistance value sensor 72 of the power supply part 32-1 can be appropriately associated with the temperature of the heater 23-1. The controller 80 is capable of calculating the temperature of the heater 23-1 with high accuracy by referring to the post-correction conversion table. Thus, it is possible to adjust the temperature of the heater 23-1 with high accuracy. The controller 80 is capable of calculating the temperatures of the plurality of heaters 23-1 to 23-n with high accuracy by referring to the plurality of post-correction conversion tables similarly to this post-correction conversion table. Thus, it is possible to adjust the temperatures of the plurality of heaters 23-1 to 23-n with high accuracy.

Figure 9:
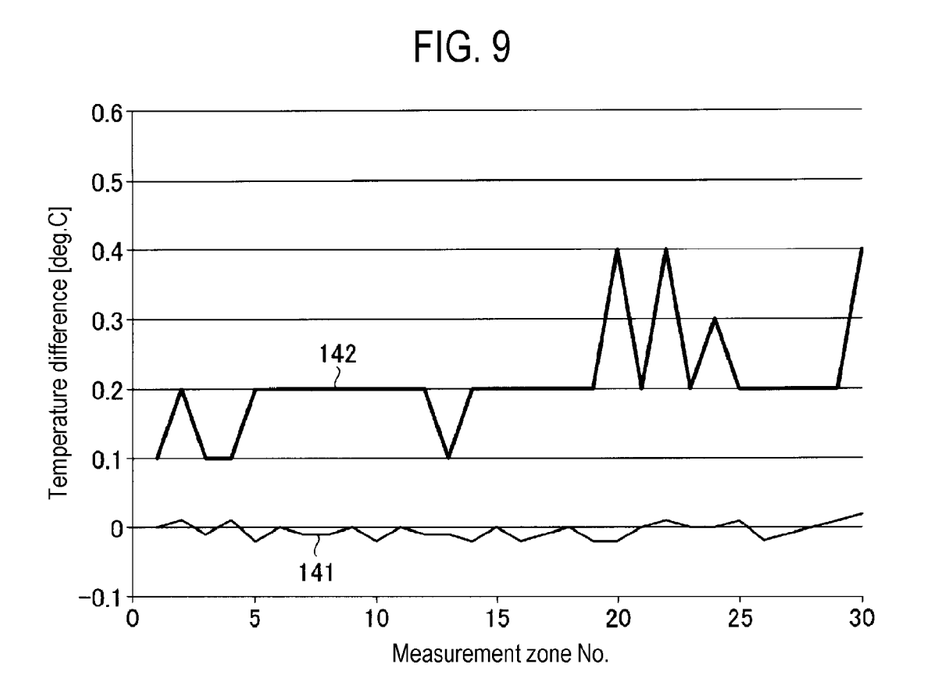
FIG. 9 is a graph showing a plurality of temperature differences in a comparative example and a plurality of temperature differences in an example in a first resistance value measurement test.

FIG. 9 is a graph showing a plurality of temperature differences in a comparative example and a plurality of temperature differences in an example in a first resistance value measurement test. In the first resistance value measurement test, the resistance values of the plurality of heaters 23-1 to 23-n are measured a plurality of times using the resistance value sensor 72, and the temperatures of the plurality of heaters 23-1 to 23-n are respectively calculated based on the measured resistance values by referring to the plurality of post-correction conversion tables. A plurality of measurement zone numbers in the graph of FIG. 9 identify the plurality of regions 66-1 to 66-n, respectively, that is, identify the plurality of heaters 23-1 to 23-n, respectively, and the resistance value sensors 72 of the plurality of power supply parts 32-1 to 32-n, respectively. A plurality of temperature differences correspond to the plurality of measurement zone numbers, that is, the plurality of heaters 23-1 to 23-n, respectively. For example, among the plurality of temperature differences, the temperature difference corresponding to the heater 23-1 indicates a value obtained by subtracting the temperature of the heater 23-1 at the first time from the temperature of the heater 23-1 at the tenth time. The temperature of the heater 23-1 at the tenth time indicates the temperature calculated based on the resistance value measured at the tenth time by the resistance value sensor 72 of the power supply part 32-1. The temperature of the heater 23-1 at the first time indicates the temperature calculated based on the resistance value measured by the resistance value sensor 72 of the power supply part 32-1 at the first time.

A bent line 142 in the graph of FIG. 9 indicates a plurality of temperature differences of the comparative example, and indicates a plurality of temperature differences when the length of the measurement interval of a plurality of resistance values is 1 sec, that is, when the measurement interval of the plurality of resistance values is shorter than the length of the interval 122. The bent line 142 indicates that the plurality of temperature differences are relatively large, and that the variation of the temperature differences is 0.26 degrees C. A bent line 141 indicates a plurality of temperature differences of the example, and indicates a plurality of temperature differences when the length of the measurement interval of a plurality of resistance values is 5 sec, that is, when the measurement interval of the plurality of resistance values is equal to the length of the interval 122. The bent line 141 indicates that the plurality of temperature differences in the example are smaller than the plurality of temperature differences in the comparative example. The bent line 141 further indicates that variation of the temperature differences in the example is 0.04 degrees C., and that the variation of the temperature differences in the example is smaller than the variation of the temperature differences in the comparative example.

The graph of FIG. 9 shows that when the resistance value measurement interval is sufficiently long, an increase in the temperatures of the plurality of heaters 23-1 to 23-$n$ caused by supplying power when measuring a resistance value is suppressed at the time of measuring the next resistance value so that the temperatures of the plurality of heaters 23-1 to 23-$n$ can be calculated with high accuracy. That is, the graph of FIG. 9 shows that the temperatures of the plurality of heaters 23-1 to 23-$n$ can be calculated with high accuracy through the offset adjustment of the substrate processing method described above. In the substrate processing system, since the temperatures of the plurality of heaters 23-1 to 23-$n$ are calculated with high accuracy, it is possible to adjust the temperature of the wafer 65 with high accuracy, and thus to appropriately process the wafer 65.

Figure 10:
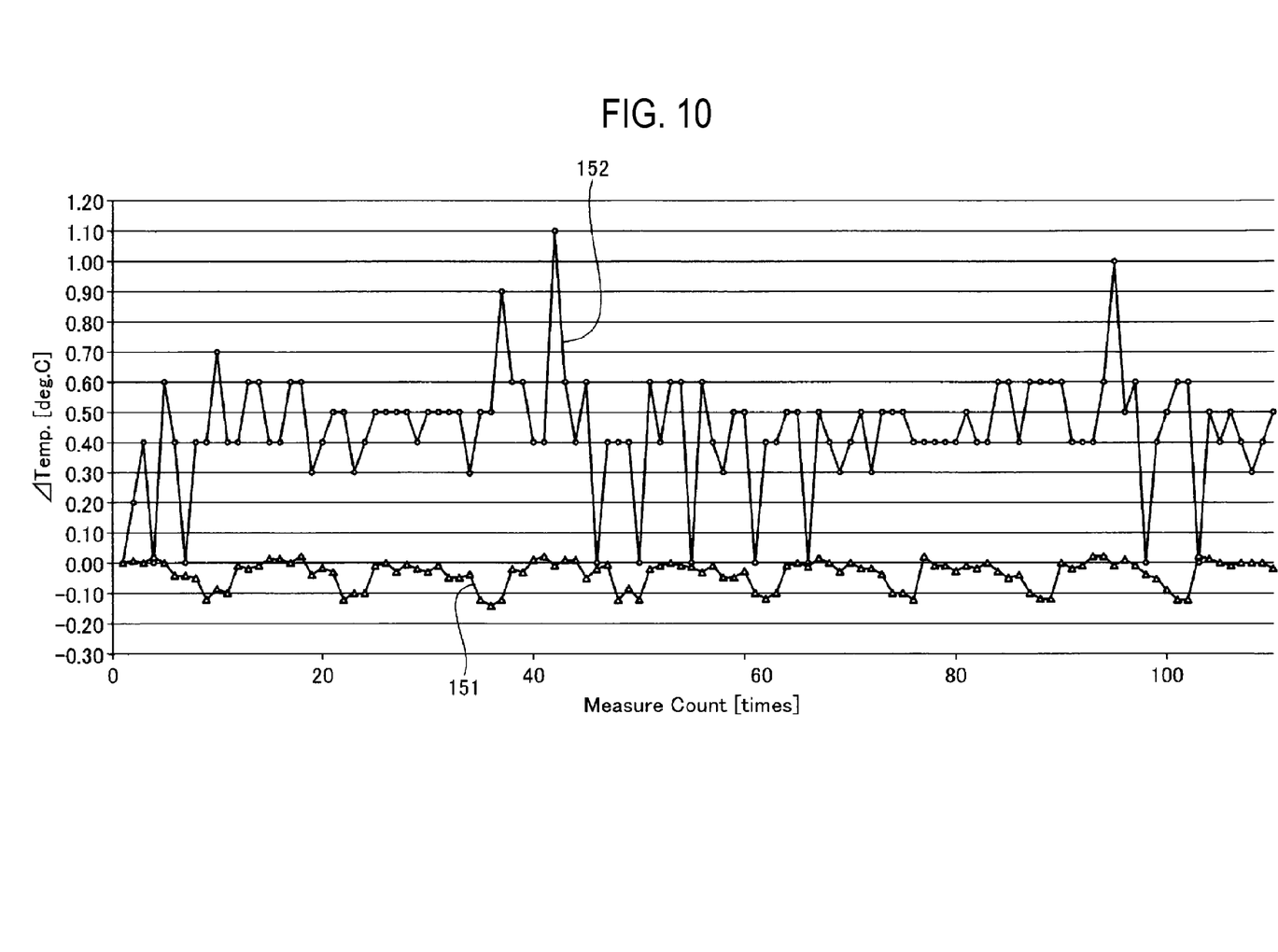
FIG. 10 is a graph showing a plurality of temperatures in the comparative example and a plurality of temperatures in the example in a second resistance value measurement test.

FIG. 10 is a graph showing a plurality of temperatures in the comparative example and a plurality of temperatures of the example in a second resistance value measurement test. In the second resistance value measurement test, the resistance value of the heater 23-1 was measured a plurality of times using the resistance value sensor 72, and the temperature of the heater 23-1 was calculated from a plurality of measured resistance values with reference to the post-correction conversion table. A bent line 152 indicates a plurality of temperatures in the comparative example. The plurality of temperatures in the comparative example indicate respective temperatures of the heater 23-1 when another heater different from and adjacent to the heater 23-1 among the plurality of heaters 23-1 to 23-$n$ is supplied with power in parallel with the heater 23-1. Among the plurality of regions 66-1 to 66-$n$, the region corresponding to the adjacent heater is adjacent to the region 66-1. The bent line 152 indicates that the variation of the temperatures in the comparative example is 0.19 degrees C., and that the variation of the temperatures in the comparative example is relatively large.

A bent line 151 indicates a plurality of temperatures in the example. The plurality of temperatures in the example indicate respective temperatures of the heater 23-1 when another heater different from and not adjacent to the heater 23-1 among the plurality of heaters 23-1 to 23-$n$ is supplied with power in parallel with the heater 23-1. Among the plurality of regions 66-1 to 66-$n$, the region corresponding to the non-adjacent heater is not adjacent to the region 66-1. The bent line 151 indicates that variation of the temperatures in the example is 0.04 degrees C., and that the variation of the temperatures in the example is smaller than the variation of the temperatures in the comparative example.

The graph of FIG. 10 shows that, by not measuring the resistance value of the heater that heats the region adjacent to the region 66-1 when the resistance value of the heater 23-1 is measured, the resistance value of the heater 23-1 is measured with higher accuracy. That is, the graph of FIG. 10 shows that the temperatures of the plurality of heaters 23-1 to 23-$n$ can be calculated with high accuracy through the offset adjustment of the substrate processing method described above. In the substrate processing system, since the temperatures of the plurality of heaters 23-1 to 23-$n$ are calculated with high accuracy through the offset adjustment, it is possible to appropriately generate a plurality of post-correction conversion tables. In the substrate processing system, since the plurality of post-correction conversion tables are appropriately generated, it is possible to calculate the temperatures of the plurality of heaters 23-1 to 23-$n$ with high accuracy. In the substrate processing system, since the temperatures of the plurality of heaters 23-1 to 23-$n$ are calculated with high accuracy, it is possible to adjust the temperature of the wafer 65 with high accuracy, and thus to appropriately process the wafer 65.

[Effect of Substrate processing System of Embodiment]

The substrate processing system of the embodiment includes the stage 11, the heater 23-1, the power supply part 32-1, the resistance value sensor 72, and the controller 80. The wafer 65 is mounted on the stage 11. The heater 23-1 heats the wafer 65 when power is supplied thereto. The power supply part 32-1 supplies power to the heater 23-1. The resistance value sensor 72 provided in the power supply part 32-1 measures the resistance value of the heater 23-1. The controller 80 stores a conversion table 111-1 in which a plurality of resistance values are associated with a plurality of temperatures, respectively, and acquires a first reference resistance value measured by the resistance value sensor 72 of the power supply part 32-1 when the temperature of the heater 23-1 is the reference temperature. The controller 80 acquires a first temperature adjustment resistance value measured by the resistance value sensor 72 of the power supply part 32-1 after the wafer 65 is heated by the heater 23-1. The controller 80 controls the power supply part 32-1 based on the conversion table 111-1, the reference temperature, the first reference resistance value, and the first temperature adjustment resistance value.

In this substrate processing system, it is possible to calculate the temperature of the heater 23-1 with high accuracy from the measured resistance value, even if the correspondence relationship between the resistance value and the temperature according to the conversion table 111-1 is shifted relative to the correspondence relationship between the measured resistance value and the temperature of the heater 23-1. In this substrate processing system, since the temperature of the heater 23-1 is calculated with high accuracy, it is possible to adjust the temperature of the heater 23-1 with high accuracy, and thus to appropriately process the wafer 65.

Further, the substrate processing system of the embodiment further includes the plurality of heaters 23-1 to 23-$n$, the plurality of power supply parts 32-1 to 32-$n$, and the plurality of resistance value sensors. The controller 80 further stores the plurality of conversion tables 111-1 to 111-$n$ corresponding to the plurality of heaters 23-1 to 23-$n$. After the first reference resistance value is measured, the controller 80 acquires a second reference resistance value measured by the resistance value sensor 72 of the power supply part 32-2 corresponding to the heater 23-2 among the plurality of power supply parts 32-1 to 32-n. The controller 80 acquires a second temperature adjustment resistance value measured by the resistance value sensor 72 of the power supply part 32-2 after the wafer 65 is heated by the heater 23-2. The controller 80 generates a post-correction conversion table by offset-adjusting the conversion table 111-2 corresponding to the heater 23-2 among the plurality of conversion tables 111-1 to 111-$n$, based on the reference temperature and the second reference resistance value. The controller 80 controls the power supply part 32-2, which supplies power to the heater 23-2, among the plurality of power supply parts 32-1 to 32-$n$, based on the temperature calculated based on the second temperature adjustment resistance value with reference to the post-correction conversion table.

In this substrate processing system, since the resistance values of the plurality of heaters 23-1 to 23-2 are measured in parallel, it is possible to measure the resistance values of all the plurality of heaters 23-1 to 23-$n$ in a short time. The substrate processing system can be set up in a short time since the resistance values of all the plurality of heaters 23-1 to 23-$n$ are measured in a short time.

In addition, the placement surface of the stage 11 of the substrate processing system of the embodiment facing the wafer 65 is divided into a plurality of regions 66-1 to 66-$n$ corresponding to the plurality of heaters 23-1 to 23-n. For example, the heater 23-1 heats the wafer 65 by heating the region 66-1 corresponding thereto among the plurality of regions 66-1 to 66-$n$. The heater 23-2 heats the wafer 65 by heating the region 66-2 corresponding thereto among the plurality of regions 66-1 to 66-$n$. In this case, the region 66-2 is arranged not to be adjacent to the region 66-1.

In this substrate processing system, it is possible to suppress thermal interference of heating the heater 23-1 while the resistance value of the heater 23-2 is being measured, and thus to measure a plurality of reference resistance values corresponding to plurality of heaters 23-1 to 23-$n$ with high accuracy. In the substrate processing system, since the reference resistance values are measured with high accuracy, it is possible to generate a plurality of post-correction conversion tables with high accuracy, and thus to calculate the temperatures of the plurality of heaters 23-1 to 23-$n$ from the measured resistance values with high accuracy.

The resistance value sensors 72 of the plurality of power supply parts 32-1 to 32-$n$ of the substrate processing system according to the embodiment respectively measures a plurality of reference resistance values corresponding to the plurality of heaters 23-1 to 23-$n$ in any measurement period among a plurality of measurement periods 121-1 to 121-$m$. For example, a third reference resistance value corresponding to the heater 23-3 among the plurality of reference resistance values is measured in the measurement period 121-2 subsequent to the measurement period 121-1 in which the first and second reference resistance values are measured, among the plurality of measurement periods 121-1 to 121-$m$. In this case, among the plurality of regions 66-1 to 66-$n$, the region 66-3 corresponding to the heater 23-3 is arranged not to be adjacent to the region 66-1 and not to be adjacent to the region 66-2.

In this substrate processing system, it is possible to suppress the thermal interference exerted from the heat of the heaters 23-1 and 23-2 on the measurement of the resistance value of the heater 23-3, and thus to measure a plurality of reference resistance values corresponding to the plurality of heaters 23-1 to 23-$n$ with high accuracy. In the substrate processing system, since the reference resistance values are measured with high accuracy, it is possible to generate a plurality of post-correction conversion tables with high accuracy, and thus to calculate the temperatures of the plurality of heaters 23-1 to 23-$n$ from the measured resistance values with high accuracy.

In the offset adjustment of the substrate processing method described above, the plurality of second regions heated in the measurement period 121-2 are not adjacent to the plurality of first regions heated in the measurement period 121-1, but may be adjacent to the plurality of first regions. Even in this case, in the substrate processing system, since the plurality of first regions are not adjacent to each other, it is possible to suppress thermal interference. Thus, it is possible to measure the reference resistance values of heaters corresponding to the plurality of first regions among the plurality of heaters 23-1 to 23-$n$, with high accuracy. In the substrate processing system, since the reference resistance values of the plurality of heaters are measured in the first measurement period 121-1, it is possible to acquire a plurality of reference resistance values corresponding to the plurality of heaters 23-1 to 23-$n$ in a short time. In the substrate processing system, it is possible to calculate the temperature of the heater 23-1 with high accuracy from the measured resistance value, even if the correspondence relationship between the resistance value and the temperature according to the conversion table 111-1 is shifted relative to the correspondence relationship between the measured resistance value and the temperature of the heater 23-1.

In the offset adjustment of the substrate processing method described above, the plurality of first regions heated in the measurement period 121-1 are not adjacent to each other, but may be adjacent to each other. Even in this case, in the substrate processing system, since the reference resistance values of the plurality of heaters are measured during one measurement period 121-1, it is possible to acquire a plurality of reference resistance values corresponding to the plurality of heaters 23-1 to 23-$n$ in a short time. In the substrate processing system, it is possible to calculate the temperature of the heater 23-1 with high accuracy from the measured resistance value, even if the correspondence relationship between the resistance value and the temperature according to the conversion table 111-1 is shifted with respect to the correspondence relationship between the measured resistance value and the temperature of the heater 23-1.

In the offset adjustment of the substrate processing method described above, the resistance values of two or more heaters are measured among the plurality of heaters 23-1 to 23-$n$ in each of the plurality of measurement periods 121-1 to 121-$m$, but only the resistance value of one heater may be measured. Even in this case, in the substrate processing system, it is possible to calculate the temperature of the heater 23-1 with high accuracy from the measured resistance value, even if the correspondence relationship between the resistance value and the temperature according to the conversion table 111-1 is shifted relative to the correspondence relationship between the measured resistance value and the temperature of the heater 23-1.

In the substrate processing apparatus 10 described above, plasma is used to etch the wafer 65, in which various types of plasma may be used. The plasma may be, for example, capacitively coupled plasma (CCP), inductively coupled plasma (ICP), or radial line slot antenna plasma. Further, the plasma may be, for example, electron cyclotron resonance plasma (ECR) or helicon wave plasma (HWP).

EXPLANATION OF REFERENCE NUMERALS

10: substrate processing apparatus, 11: stage, 23-1 to 23-$n$: plurality of heaters, 32-1 to 32-$n$: plurality of power supply parts, 33: chiller unit, 65: wafer, 66-1 to 66-$n$: plurality of regions, 71: switch, 72: resistance value sensor, 80: controller, 111-1 to 111-$n$: plurality of conversion tables, 121-1 to 121-$m$: plurality of measurement periods

What is claimed is:

1. A substrate processing system comprising:
a stage on which a substrate is placed;
a plurality of heaters configured to heat the substrate by being supplied with power;
a plurality of power supply parts configured to supply power to the plurality of heaters, respectively;
a plurality of sensors corresponding to the plurality of heaters; and
a controller,
wherein the controller is configured to:
store a plurality of conversion tables corresponding to the plurality of heaters, a plurality of resistance values in the plurality of conversion tables being associated with a plurality of temperatures;
acquire a plurality of reference resistance values corresponding to the plurality of heaters, the plurality of reference resistance values being measured by the plurality of sensors when a temperature of one heater among the plurality of heaters is a reference temperature;
acquire a plurality of temperature adjustment resistance values corresponding to the plurality of heaters, the plurality of temperature adjustment resistance values being measured by the plurality of sensors after the substrate is heated by the plurality of heaters; and
control the plurality of power supply parts based on the plurality of conversion tables, the reference temperature, the plurality of reference resistance values, and the plurality of temperature adjustment resistance values,
wherein the plurality of sensors respectively measure the plurality of reference resistance values in any of a plurality of measurement periods,
a first reference resistance value corresponding to a first heater among the plurality of reference resistance values is measured in a first measurement period among the plurality of measurement periods,
a second reference resistance value corresponding to a second heater among the plurality of reference resistance values is measured in a second measurement period among the plurality of measurement periods, subsequent to the first measurement period,
a second region corresponding to the second heater among a plurality of regions is arranged not to be adjacent to a first region corresponding to the first heater among the plurality of regions, and
the controller is further configured to set a length of an interval between the plurality of measurement periods based on a time when a temperature of the first heater decreases and becomes equal to a chiller temperature after the first measurement period among the plurality of measurement periods in which power is supplied to the first heater corresponding to the first measurement period.

2. The substrate processing system of claim 1, wherein the controller is configured to:
acquire the first reference resistance value measured by a first sensor corresponding to the first heater among the plurality of sensors after a reference resistance value is measured;
acquire a first temperature adjustment resistance value measured by the first sensor after the substrate is heated by the first heater; and
control a first power supply part configured to supply power to the first heater among the plurality of power supply parts based on a first conversion table corresponding to the first heater among the plurality of conversion tables, the reference temperature, the first reference resistance value, and the first temperature adjustment resistance value.

3. The substrate processing system of claim 2, wherein a placement surface of the stage facing the substrate is divided into the plurality of regions corresponding to the plurality of heaters including the one heater,
the one heater heats the substrate by heating one region corresponding thereto among the plurality of regions,
the first heater heats the substrate by heating the first region corresponding thereto among the plurality of regions, and
the first region is arranged not to be adjacent to the one region.

4. The substrate processing system of claim 3, wherein during the first measurement period, the reference resistance value and the first reference resistance value are measured.

5. The substrate processing system of claim 1, wherein the interval between the plurality of measurement periods is equal to a predetermined length.

6. The substrate processing system of claim 1, wherein the plurality of sensors respectively measure a plurality of reference resistance values corresponding to the plurality of heaters in any of the plurality of measurement periods,
a third reference resistance value corresponding to a third heater among the plurality of reference resistance values is measured in a third measurement period among the plurality of measurement periods, subsequent to the first measurement period or the second measurement period, and
a third region corresponding to the third heater among the plurality of regions is arranged not to be adjacent to the first region and the second region.

7. A substrate processing method executed using a substrate processing apparatus comprising a stage on which a substrate is placed, a plurality of heaters configured to heat the substrate by being supplied with power, a plurality of power supply parts configured to supply power to the plurality of heaters, respectively, and a plurality of sensors corresponding to the plurality of heaters,
wherein the substrate processing method comprises:
storing a plurality of conversion tables corresponding to the plurality of heaters, a plurality of resistance values in the plurality of conversion tables being associated with a plurality of temperatures;
acquiring a plurality of reference resistance values corresponding to the plurality of heaters, the plurality of reference resistance values being measured by the plurality of sensors when a temperature of one heater among the plurality of heaters is a reference temperature;
acquiring a plurality of temperature adjustment resistance values corresponding to the plurality of heaters, the plurality of temperature adjustment resistance values being measured by the plurality of sensors after the substrate is heated by the plurality of heaters; and
controlling the plurality of power supply parts based on the plurality of conversion tables, the reference temperature, the plurality of reference resistance values, and the plurality of temperature adjustment resistance values,
wherein the plurality of sensors respectively measure the plurality of reference resistance values in any of a plurality of measurement periods,
a first reference resistance value corresponding to a first heater among the plurality of reference resistance values is measured in a first measurement period among the plurality of measurement periods, a second reference resistance value corresponding to a second heater among the plurality of reference resistance values is measured in a second measurement period among the plurality of measurement periods, subsequent to the first measurement period, a second region corresponding to the second heater among a plurality of regions is arranged not to be adjacent to a first region corresponding to the first heater among the plurality of regions, and the substrate processing method further comprises: setting a length of an interval between the plurality of measurement periods based on a time when a temperature of the first heater decreases and becomes equal to a chiller temperature after the first measurement period among the plurality of measurement periods in which power is supplied to the first heater corresponding to the first measurement period.

* * * * *